United States Patent
Albermann et al.

(10) Patent No.: US 9,601,437 B2
(45) Date of Patent: Mar. 21, 2017

(54) PLASMA ETCHING AND STEALTH DICING LASER PROCESS

(71) Applicant: NXP B.V., Eindhoven (DE)

(72) Inventors: Guido Albermann, Hamburg (DE);
Sascha Moeller, Hamburg (DE);
Thomas Rohleder, Hamburg (DE);
Martin Lapke, Hamburg (DE);
Hartmut Buenning, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/481,051

(22) Filed: Sep. 9, 2014

(65) Prior Publication Data

US 2016/0071770 A1    Mar. 10, 2016

(51) Int. Cl.
*H01L 21/78* (2006.01)
*H01L 21/304* (2006.01)
*H01L 21/306* (2006.01)
*H01L 23/544* (2006.01)
*H01L 21/683* (2006.01)

(52) U.S. Cl.
CPC ........ *H01L 23/544* (2013.01); *H01L 21/6836* (2013.01); *H01L 21/78* (2013.01); *H01L 2221/6834* (2013.01); *H01L 2221/68336* (2013.01); *H01L 2924/0002* (2013.01)

(58) Field of Classification Search
CPC ....... H01L 21/6836; H01L 2221/68327; H01L 21/78; H01L 2924/3512; H01L 2221/6834
See application file for complete search history.

(56) References Cited

U.S. PATENT DOCUMENTS

| 8,975,163 | B1* | 3/2015 | Lei | .......................... H01L 21/78 257/E21.602 |
| 2002/0013061 | A1* | 1/2002 | Siniaguine | ............ H01L 21/441 438/706 |
| 2002/0127824 | A1* | 9/2002 | Shelton | .............. B23K 26/0656 438/463 |
| 2005/0045276 | A1* | 3/2005 | Patel | ................... B81C 1/00476 156/345.43 |
| 2006/0121697 | A1* | 6/2006 | Fujii | .................. B23K 26/0057 438/460 |
| 2009/0121337 | A1* | 5/2009 | Abe | ................... B23K 26/0057 257/686 |

(Continued)

FOREIGN PATENT DOCUMENTS

EP     1 825 507 B1     9/2011

OTHER PUBLICATIONS

"Laser Application." DISCO Corporation, Tokyo, Japan. pp. 8.

*Primary Examiner* — Khaja Ahmad (57) ABSTRACT

Consistent with an example embodiment, a method for preparing integrated circuit (IC) device die from a wafer substrate having a front-side with active devices and a back-side, comprises mounting the front-side of the wafer onto protective foil. A laser is applied to saw lane areas on the backside of the wafer, at a first focus depth to define a modification zone; the modification zone defined at a predetermined depth within active device boundaries and the active device boundaries defined by the saw lane areas. The protective foil is stretched to separate IC device die from one another and expose active device side-walls. With dry-etching of the active device side-walls, the modification zone is substantially removed.

19 Claims, 7 Drawing Sheets

(56) References Cited

U.S. PATENT DOCUMENTS

| | | |
|---|---|---|
| 2009/0191690 A1 | 7/2009 | Boyle et al. |
| 2011/0136322 A1* | 6/2011 | Sato .................. C09J 7/0278 |
| | | 438/464 |
| 2012/0158169 A1 | 6/2012 | Finn et al. |
| 2012/0329246 A1 | 12/2012 | Finn |
| 2014/0145294 A1 | 5/2014 | Moeller et al. |
| 2014/0217556 A1* | 8/2014 | Peh .................. H01L 21/78 |
| | | 257/620 |
| 2015/0069578 A1 | 3/2015 | Buenning et al. |

\* cited by examiner

☐ XeF2 Dry Etching Gas 55
▨ Laser induced modification layer after laser dicing (poly Si) 415
☐ Monocristalline Silicon (mono Si) 425
▨ Carrier Tape 430
▨ Laser induced modification layer after dry etching (mono Si) 435

PLASMA ETCHING AND STEALTH DICING LASER PROCESS

FIELD

The embodiments of the present disclosure relate to the preparing of semiconductor wafers having active device die so as to increase the yield of those device die when packaged, in particular device die packaged in radio frequency identification devices (RFID) tags. In particular, the disclosure relates to an etching process to reduce the incidence of sidewall cracking on device die.

BACKGROUND

Integrated circuits (ICs) are typically produced by forming a plurality of ICs on a semiconductor substrate, such as silicon. The ICs include one or more layers formed on the substrate (e.g., semiconductor layers, insulation layers, and metallization layers). The individual ICs are separated by lanes. The finished ICs on the wafer are then separated into individual ICs by, for instance, sawing the wafer along the lanes. Separation of the wafer into individual ICs may be referred to as dicing. Sawing may be performed using various mechanical cutting and laser cutting methods. Mechanical cutting tools tend to cause chipping of the back-side or front-side of a substrate. Laser cutting tends to cut unevenly in metallization layers covering entirely or partly the saw lanes of the substrate.

During a stealth laser dicing process, the laser focuses into the material and melts the mono-crystalline silicon. The material re-crystallizes as polycrystalline silicon, which induces stress into the material due to higher volume of the poly-crystalline structure. This stress creates a crack, which is used for die separation.

For one particular type of product, a radio frequency identification device (RFID) tags, the feature for the die separation has become a challenge during the later stages of the RFID tag production process. Once the device die is embedded in a glue within the RFID tag, bending forces may be transferred from the die side into the laser modification zone (on the sidewalls of the embedded die) resulting in cracking at die edges.

There exists a need for eliminating this shortcoming in the assembly of RFID devices.

SUMMARY

The present disclosure has been found useful in the packaging of semiconductor devices which find their way into RFID tags and the like. RFID tags and other smart card devices undergo mechanical stress during their lifetime. For example, putting an RFID-enabled card in one's pocket can exert stress on the packaging structures. Over time, the accumulated stress of bending and crushing wears out the package and one or more electrical/mechanical connections to the RFID are broken; the RFID equipped device no longer works.

During the assembly process, side-wall stresses accumulate in the assembled device die. These stresses result from the wafer sawing/separation. In an example embodiment, a laser is used to cut through saw lanes of the active devices on the wafer substrate. The laser provides for narrower saw lanes between devices. For example a saw lane of about 15 µm is possible versus 80 µm for saw lanes cut with mechanical blade. However, the laser introduces modification zones of poly-crystalline silicon in cut areas where previously they were part of the single-crystal structure of the semiconductor device. These modifications zones are vulnerable to stress; the stress may cause cracks to begin in these modification zones and propagate into active areas of the semiconductor device. A dry-etching process removes these modification zones so that side-walls are substantially free of poly-silicon which in turn reduces the side-wall stress and lessens the probability of cracking.

In an example embodiment, there is a method for preparing integrated circuit (IC) device die from a wafer substrate having a front-side with active devices, the active devices having boundaries defined by saw lanes and a back-side. The method comprises mounting the front-side of the wafer onto protective foil. A laser is applied to the saw lane areas on the backside of the wafer, at first focus depth to define a modification zone, the modification zone defined at a predetermined depth within active device boundaries. The protective foil is stretched to separate IC device die from one another and expose active device side-walls. The active device side-walls are dry-etched so that the modification zone is substantially removed.

In another example embodiment, an integrated circuit (IC) device die comprises an active device on a front-side surface and an under-side surface opposite the front-side surface; the active device is bounded by saw lanes. A plurality of vertical side walls are in the vicinity of the saw lanes, wherein the plurality of vertical side walls have modification zones of poly-crystalline silicon defined therein. The modification zones have been exposed to a plasma etch such that substantially all of the poly-crystalline silicon has been removed.

In an example embodiment, there is a method for preparing a laser cut device die with reduced side-wall stress, from a wafer substrate. The method comprises using a laser to cut the wafer substrate along saw lanes, the saw lanes defining device boundaries, so as to yield individual device die, An etch is used laser-induced stress to the side-walls of the individual device die The above summaries of the present disclosure are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The disclosed embodiments have been found useful in preventing damage to active device die prepared for packaging in RFID tags, and the like. In an example, process, a "stealth dicing" process may be used for separating such a wafer into individual ICs. Stealth laser dicing allows for reduction of saw lane width spacing, from the normal width of about 60 μm about to 80 μm to a minimum width of about 15 μm. With this reduced saw lane width, the amount of potential good dies per wafer (PGDW) can be significantly increased. During this stealth laser dicing process, a modification zone is implemented into the silicon layer of the already thinned wafer. This modification zone leads to a crack that later can be used to separate the dies from each other with an expansion process.

Channels are formed in the one or more metallization layers on a front-side of the wafer along respective lanes along which the ICs are to be separated. These (separation) lanes are located between ICs and extend between a front-side of the wafer at the metallization layer(s), and a backside of the wafer at the silicon substrate. After forming the channels, the backside of the silicon substrate is thinned, and laser pulses are applied via the backside of the silicon substrate to change the crystalline structure of the silicon substrate along the lanes. This change in the silicon structure weakens the silicon in the lanes. The changed portions (i.e., "modification zone") in the silicon substrate and the channels facilitate the propagation of cracks in the silicon substrate along the lanes during expansion of the wafer, while mitigating propagation of cracks outside of the lanes. With this approach, wafer separation can be achieved while mitigating issues that can arise from the formation of cracks.

Figure 1:
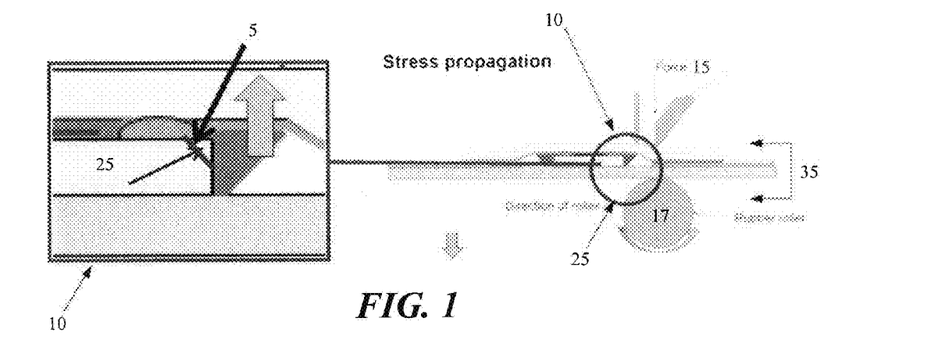
FIG. 1 illustrates the sources of stress in an IC device assembled in an RFID package.
Figure 2A:
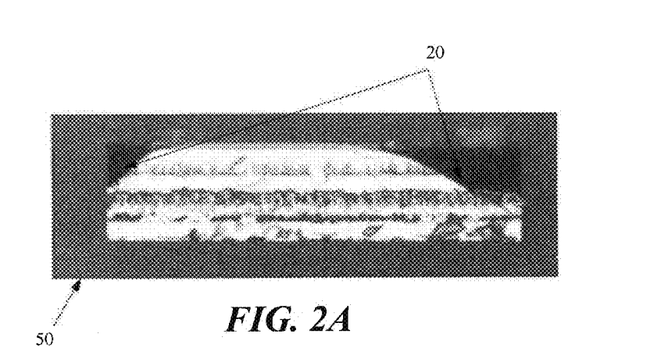
FIGS. 2A-2B illustrate the device die edge cracking as a result of the stresses shown in FIG. 1.
Figure 2B:
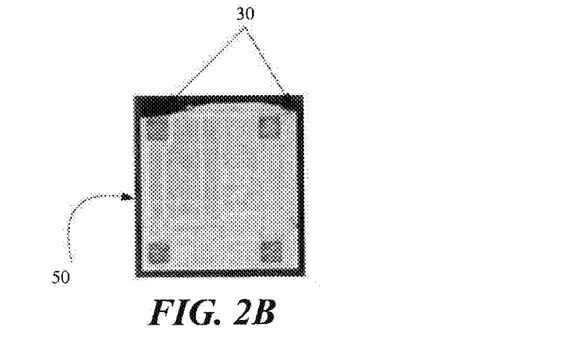

However, with the "stealth dicing" process, there is a possibility of excessive die stress after the device die is packaged into an RFID tag. The die may crack along areas modified by the laser, resulting in reliability issues with the RFID tag to outright failure. Refer to FIG. 1. An assembled device die 25 in an RFID tag 35 is subjected to stress exerted by blades 15 and roller 17, not unlike forces a user's tag would encounter by being placed in a back pocket of his trousers. Area 10 shows an enlarged area to at which a stress 5 is significant. Refer to FIGS. 2A-2B. An example device die 50 (in a side-view) shows the cracking 20 along the edges. The same example device die 50 (in a top-view) shows cracking 30 along some edges.

More details of "stealth dicing" may be found in U.S. patent application (Ser. No. 13/687,110) of Sascha Moeller and Martin Lapke titled, "Wafer Separation" filed on Nov. 28, 2012 and is incorporated by reference in its entirety.

Further information on "stealth dicing" and "laser ablation" may be found in the product brochure titled, "Laser Application" of DISCO Corporation, Tokyo, Japan.

Additionally, a process for increasing device die yield for RFID tags may be found in U.S. patent application (Ser. No. 14/204,858 filed on Mar. 11, 2014) of Guido Albermann et al, titled, "Combination Grinding after Laser (GAL) and Laser On-Off Function to Increase Die Strength," and is incorporated by reference in its entirety.

However, in the instant disclosure, it has been observed that there is an increased incidence of device die cracking directly attributable to the size of the modification layer. The removal of the modification zone with a dry etching process with a suitable etchant, such as xenon di-fluoride ($XeF_2$) gas, enhances not only the side-wall strength of the device die but also the whole device die structure, thereby mitigating device die cracking during assembly and allowing for a 15 μm saw lane for use with stealth dicing. Other gas etchants may include, in addition to $XeF_2$, bromine tri-fluoride ($BrF_3$), chlorine tri-fluoride ($ClF_3$), and fluorine ($F_2$).

In an example process, the modification zone may be removed with the following recipe. The etching equipment used is a Xactix® $XeF_2$ Release Etch System manufactured by SPTS, San Jose, Calif.

TABLE 1

Example $XeF_2$ Etching Recipe

| Description | Range | Comments |
| --- | --- | --- |
| $XeF_2$ flow rate | 0.5 sccm-500 sccm | One example process uses flow rates of about 5 sccm-50 sccm. |
| Cycle Time | 1 s-9000 s | One example process uses cycle times of 120 s to about 180 s. |
| Base Pressure | 1-100 mTorr | One example process uses a base pressure of about 21 mTorr. |
| Chamber | Shower Head Design; exhaust below wafer-chuck center. | Xactix ® $XeF_2$ Release Etch System used in example process |

In an example embodiment, the etching of the modification zone is done with a $XeF_2$ flow rate in the range of about 5 sccm to about 50 sccm (standard cubic centimeters per minute), a cycle time of about 120 seconds to about 180 seconds. The pressure used in this example embodiment is about 21 mTorr.

Figure 3:
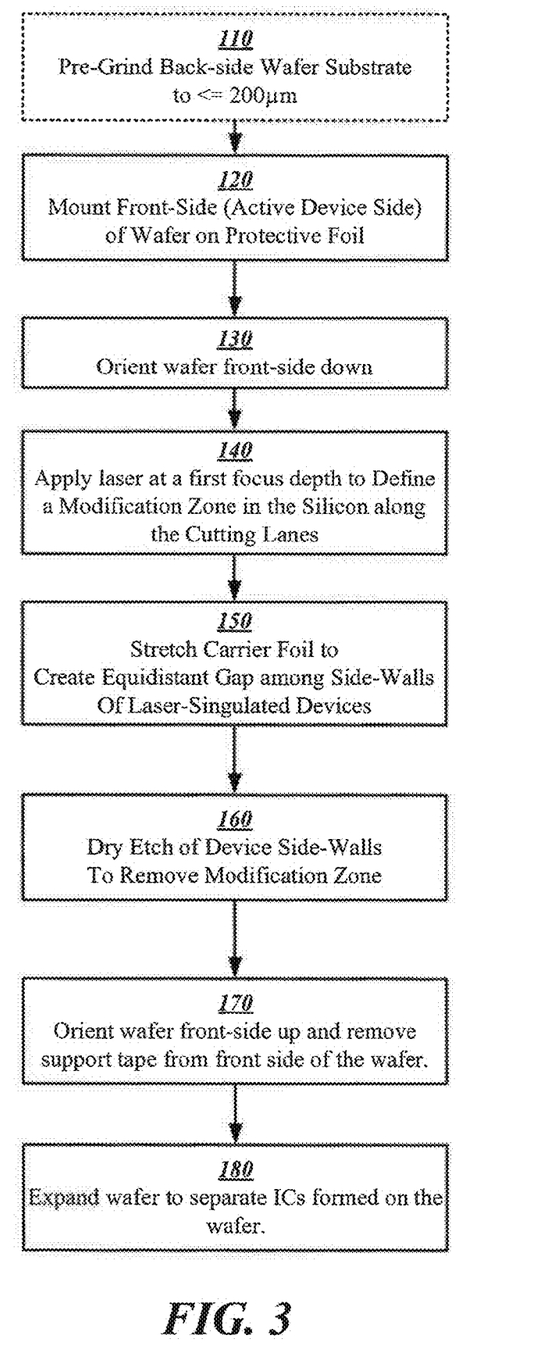
FIG. 3 is a flow diagram of an process for preparing wafers according to an example embodiment.

Refer to FIG. 3. In an example process at step 110, a wafer substrate having active device die on the front-side, undergoes a pre-back-grinding. For example, a pre-grinding thickness, of an eight-inch wafer (200 mm) is about 725 μm, for a six-inch wafer (150 mm) is about 675 μm. Note that this technique may be applied to wafer substrates of any size and may be useful for twelve-inch (300 mm) substrates. In an example process, a wafer is ground to a thickness of about 200 μm. It is desirable to achieve a minimum wafer thickness; however, it is limited by the technical ability to thin down wafers with 200 μm bumps. Thickness, in an example process, may be in the range of about 150 μm to about 250 μm. Next in step 120, the front-side of back-ground wafer substrate is mounted onto a protective foil. Then in step 130, the now-protected wafer substrate is oriented so that the back-side surface is exposed to the dicing laser. In step 140, the laser is applied to the back-side of the wafer at a first focus depth to define a modification zone. Through infra-red or other imaging techniques, the position of the cutting lanes (i.e., saw lanes) is determined prior to cutting. In step 150, the carrier foil is stretched to create an equidistant gap among side-walls of the laser-singulated device. In step 160, the device side-walls are dry etched, with a suitable etchant, to remove the modification zone. In an example embodiment, xenon di-fluoride ($XeF_2$) is used. At step 170, the wafer is re-oriented front-side up so that the support tape may be removed. In step 180, the wafer is expanded to separate out the ICs that will be embedded into the RFID tag 180. During the etching, there should be no substantive difference in etch selectivity between mono- or poly-crystal-Si. Further, to etch to a pre-determined depth there was no substantive difference in time between mono-crystalline silicon and poly-crystalline silicon. There should also be no difference in the etch rate depending on crystal orientation (e.g., {100}, {110}, and {111}).

In another example embodiment, the sidewalls may be etched with a suitable wet etchant to remove the modification zone. However, the active device areas would need to be protected from undesired etching from the wet etch.

Figure 4A:
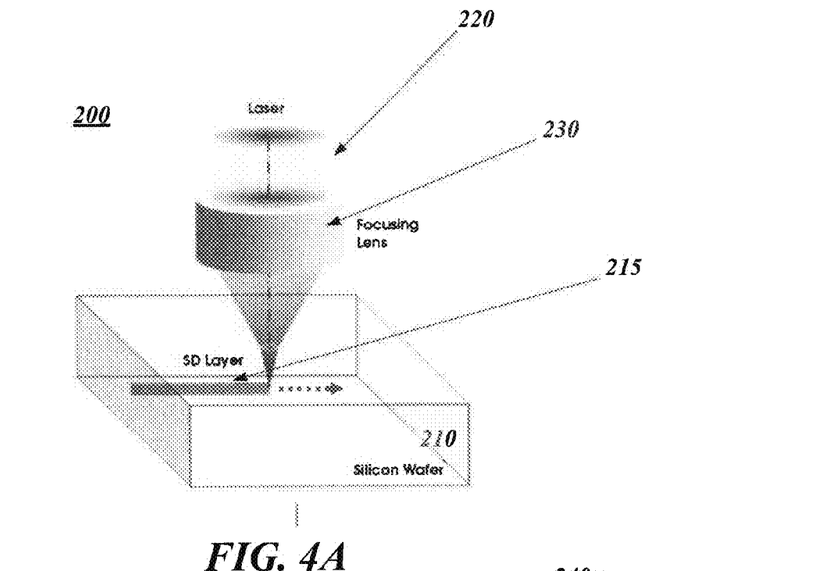
FIGS. 4A-4B depict an example laser dicing process.
Figure 4B:
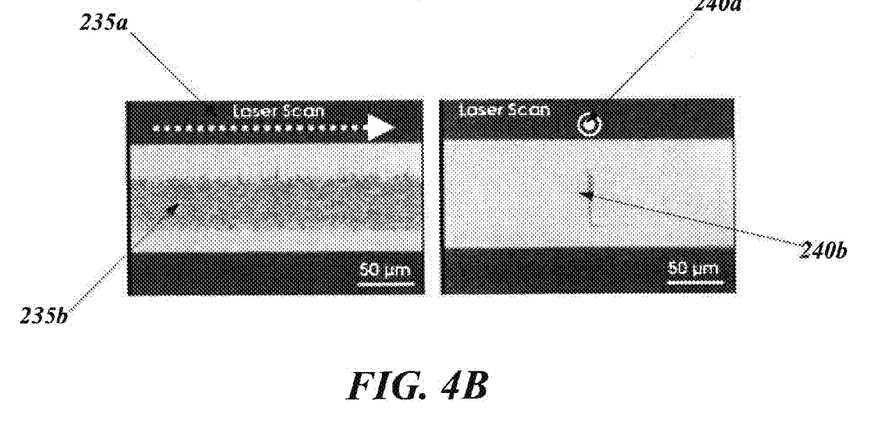

Refer to FIGS. 4A-4B. In an example embodiment, an apparatus 200 with a lasers 220 focused at a prescribed depth (with a lens 230) performs a stealth laser dicing of a wafer substrate 210 on a saw lane 215. The modification zone 235b of the laser scan 235a having a length of about 300 µm with a depth of about 50 µm is shown; the modification zone 240b (at a point) of the laser scan 240a is at a depth of about 50 µm and having a length of less than about 5 µm.

Figure 5A:
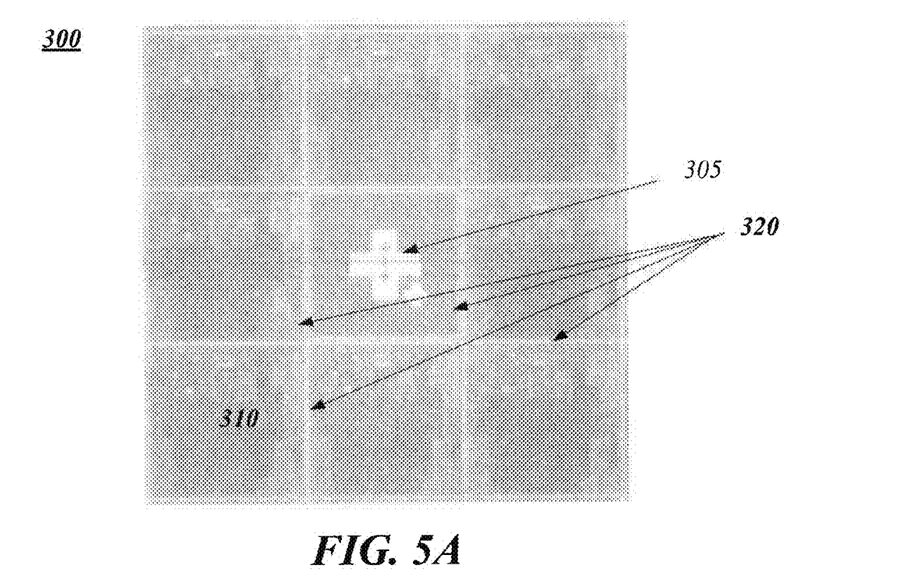
FIGS. 5A-5B is an example of locating the active device with infra-red imaging through the wafer substrate backside.
Figure 5B:
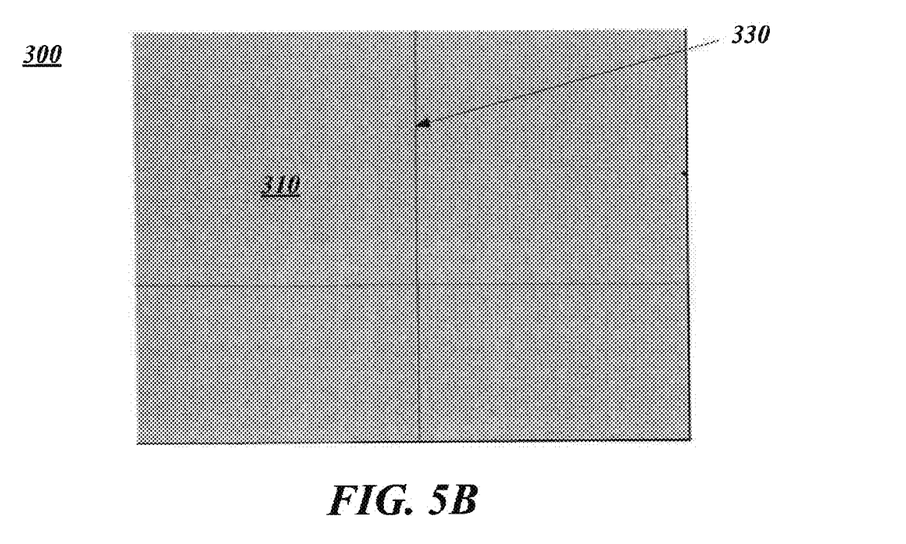
Figure 6A:
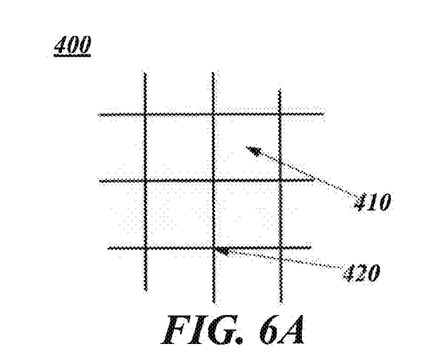
FIGS. 6A-6D illustrate an example embodiment of etching the silicon modification layer.
Figure 6B:
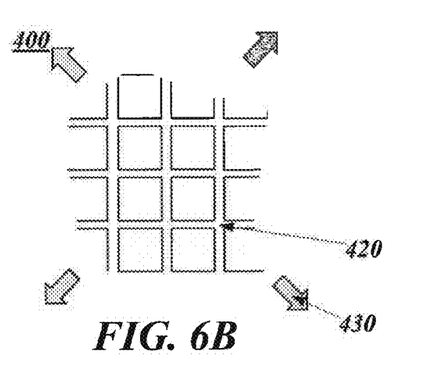
Figure 6C:
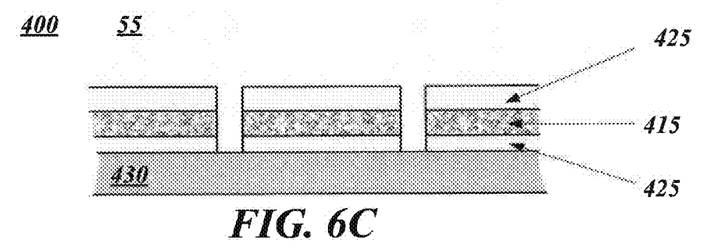
Figure 6D:
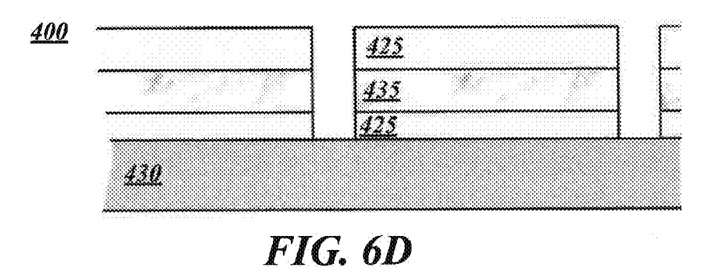

Refer to FIGS. 5A-5B. In an example embodiment, a wafer substrate 300 having device die 310 is scanned via infra-red shown in the alignment sight 305. The saw lanes 320 are visible. The infra-red imaging permits the laser to perform the dicing of the saw lanes 320 which result in modification zones 330.

Refer to FIGS. 6A-6D. Wafer substrate 400 having device die 410 has been laser diced on the saw lanes 420. The carrier foil 430 is stretched so that equidistant spacing between the device die 410 is attained. The stretched-apart wafer 400 is placed into an etching apparatus. In one example embodiment, xenon di-fluoride ($XeF_2$) 55 is introduced. The laser-induced modification zone 415 (between mono-crystalline layers 425) is etched so that the poly-crystalline silicon is substantially etched away leaving minimal poly-silicon 435.

Figure 7A:
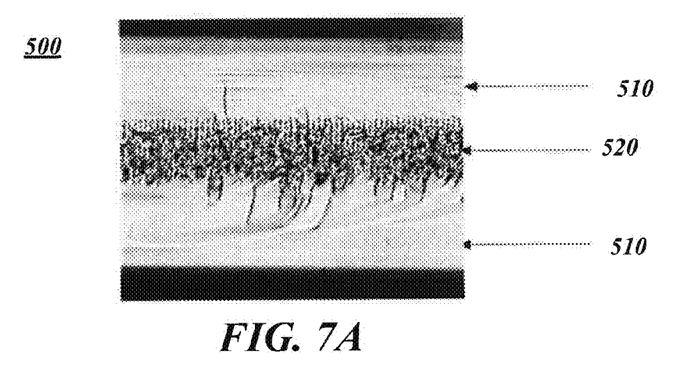
FIGS. 7A-7B show an example of a silicon modification layer and its etching.
Figure 7B:
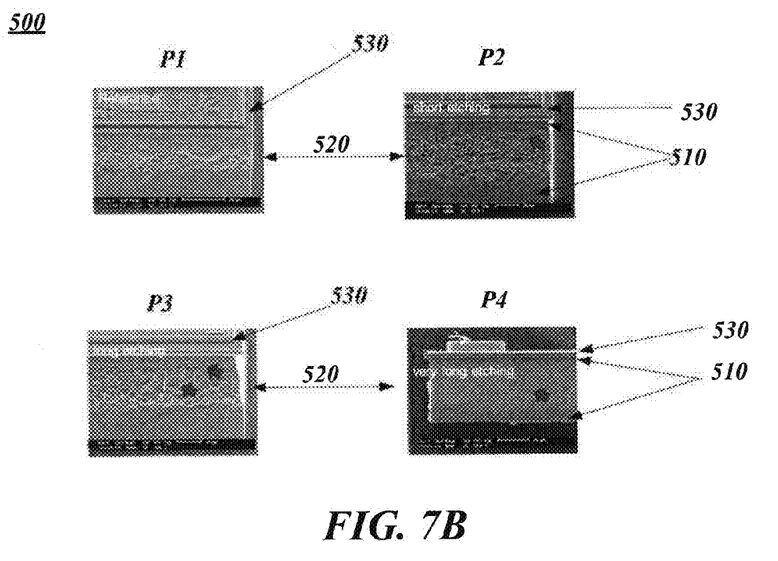

Refer to FIGS. 7A-7B. In an example embodiment, having etched the device die, the user may observe on a device die 500 a modification zone of poly-silicon 520 sandwiched between mono-crystalline layers 510. The active device 530 is on the surface. Panels P1-P4 of FIG. 7B show example of the plasma etching of the modification layer 510 with P1 have the least amount of etching and P4 having the greatest amount. P2 has more etching than the reference P1, but less etching than P3; P3 has less etching than P4.

In applying the etching to the modification zone, the dimension of the modification zone is not directly measurable; however, the appropriate amount of etching is determined by the shift of the distribution of the fracture strength values. The amount of material to be etched away may be determined, by running a design of experiments (DoE) and determining the point, at which the target improvement of die strength is achieved. One may see, that the target can be reached already for cases, where the modification zone is optically only slightly different from before (topography is not changed by etching, only stress is removed).

Refer to Table 1. Based on a study with a limited number of samples processed, one can conclude, that there is a significant difference between the side-wall treated groups and the reference. However, the statistical data also shows significant influence of other parameters, which are currently not analyzed or modelled yet (poor $R^2$ values).

In one embodiment, these factors are caused by the non-optimized design of the device for the process used and by the narrow opening of the kerf (inhomogeneous penetration of etchant into the kerf). The under-etching of the seal ring area and the part of the front-end structures is introducing new types of weak spots and new fracture mechanisms. To utilize the full potential of the process, the design of the device (scribe-lane width, passivation structure) would need to be adapted, to prevent forming of large overhang while allowing sufficient removal amount at the same time.

TABLE 1

One-way ANOVA: Fracture Stress (MPa) versus Process/Removal Combination

| Source | DF | SS | MS | F | P |
|---|---|---|---|---|---|
| Pre/Removal | 4 | 21368240 | 5342060 | 12.38 | 0 |
| Error | 415 | 1.79E+08 | 431418 | | |
| Total | 419 | 2E+08 | | | |

S = 656.8  R-Sq = 10.66%  R-Sq(adj) = 9.80%

| Level | N | Mean | StDev |
|---|---|---|---|
| Reference__none | 60 | 640.7 | 252.6 |
| SF6__less | 90 | 965.8 | 458.2 |
| SF6__more | 90 | 1373.1 | 919.1 |
| Xe2F__less | 90 | 1176.2 | 709.5 |
| Xe2F__more | 90 | 1104.1 | 641.4 |

Pooled StDev = 656.8

Figure 8:
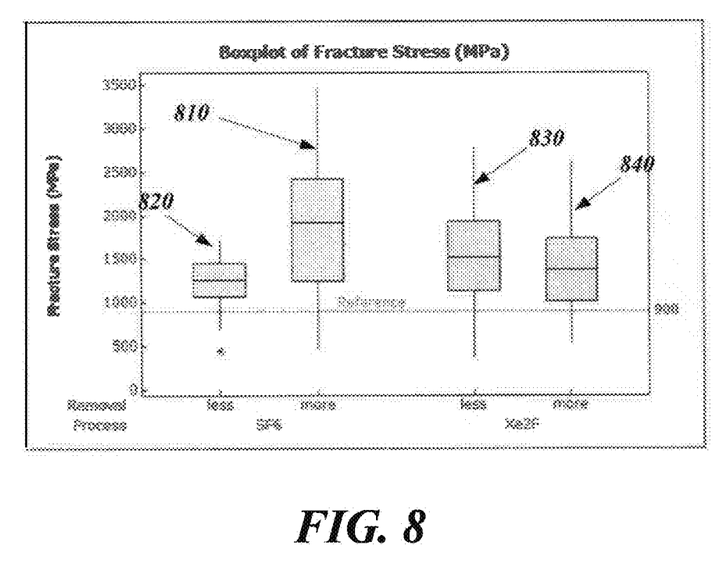
FIG. 8 depicts a box plot of fracture stress v. degree of removal for two example process gases.

FIG. 8 illustrates the die strength improvement by using two different processes and etchants. The first gas is $SF_6$ and the second gas is $XeF_2$. The process with $SF_6$ shows two box plots, one process 820 having less gas (i.e., the gas being dispensed at a lower pressure and/or flow rate) and one 810 having more gas (i.e., the gas being dispensed at a higher pressure and/or flow rate). Likewise, the process with $XeF_2$ shows two box plots one with less gas (830) and more gas (840).

The samples used are from a representative RFID tag product, with scribe lanes which are free of process control structures and other metal features. As can be seen from the ANOVA table, the variation of the fracture strength increases compared to the reference, while the average improves. One can attribute the increased variation to inhomogeneity of the kerf width and the different amount of under-etching due to variations in the stealth dicing kerf-position (i.e., meandering).

The RFID/Tag environment itself cannot be definitely specified as it is varying from product to product and per production process step. The die strength is determined by multiple factors of previous process steps, such as grinding or dicing. However, for example, a typical fracture strength is 600 MPa. Improvements of about 20%, that is greater than 700 MPa will already improve the performance in further production steps.

The ratio of improvement of die strength by removal of the modification zone was found to be about 200 MPa for a removal of about 0.1 µm (in the range of 0-1 µm). However when etching more than 1 µm in total a decrease of the die strength was observed, supposed to be related to etching below the front-end structures.

The design of the device to be subject to the proposed process needs to be optimized to achieve the best results. Generally, it can be said that a higher removal amount will increase the fracture strength, if negative side effects can be eliminated. To achieve this, the distance between the seal rings of the dies needs to be large enough, to make sure that the removal of material does not advance below the seal ring. Also, the area intended for etching should be free of passivation material, etc. In an example process, one could introduce a vertical etch stop into the device design (e.g. a modified seal ring structure). The exact design depends on the selectivity of the used gas, the thickness of the device, the distance between the devices, the process speed and the dicing tape used.

In an example test, the etching has completely removed the modification zone, so one may optically see in the SEM analysis that it is gone (See FIG. 7B). The overlap on the extreme picture P4 with very long etching is about 8 μm. The modification zone would be smaller than that (based on TEM analysis in literature).

In an example process, the pulse frequency is determined by the laser engine in use. The distance of the modification spots is determined by the dicing speed (usually 300 mm/s) and the pulse frequency. For one embodiment, the SDE03, it is about 3 μm. The spot size is depends on the laser power used, which may range from about 0.8 watts to about 1.4 watts (depending on thickness and substrate type).

steps. Where an indefinite or definite article is used when referring to a singular noun, e.g. "a" "an" or "the", this includes a plural of that noun unless something otherwise is specifically stated. Hence, the term "comprising" should not be interpreted as being restricted to the items listed thereafter; it does not exclude other elements or steps, and so the scope of the expression "a device comprising items A and B" should not be limited to devices consisting only of components A and B. This expression signifies that, with respect to the present disclosure, the only relevant components of the device are A and B.

Numerous other embodiments of the invention will be apparent to persons skilled in the art without departing from the spirit and scope of the invention as defined in the appended claims.

The invention claimed is:

TABLE 2

Example Processes for Stealth Laser Dicing.

| | | SDE01/DISCO | ML200/ACCT | ML300/ACCT | ML200+/ACCT | ML300+/ACCT | SDE03/DISCO |
|---|---|---|---|---|---|---|---|
| Average Power | W | 0.8 | 0.8 | 0.8 | 1 | 1 | 1.4 |
| Pulse width FWHM | ns | 150 | 150 | 150 | 350 | 350 | 90 |
| Repetition rate | kHz | 80 | 80 | 80 | 90 | 90 | 90 |
| Wavelength | nm | 1064 | 1064 | 1064 | 1085 | 1085 | 1342 |
| Peak Power | W | 62.63 | 62.63 | 62.63 | 29.82 | 29.82 | 162.37 |
| Duty Cycle | :1 | 0.0120 | 0.0120 | 0.0120 | 0.0315 | 0.0315 | 0.0081 |
| p-t-p time | ms | 0.01250 | 0.01250 | 0.01250 | 0.1111 | 0.01111 | 0.01111 |
| Pulse Energy | μJ | 10.00000 | 10.00000 | 10.00000 | 11.11111 | 11.11111 | 15.55556 |
| Photons per Pulse | | 5.36E+13 | 5.36E+13 | 5.36E+13 | 6.07E+13 | 6.07E+13 | 1.05E+14 |
| Photon Energy | eV | 1.17 | 1.17 | 1.17 | 1.14 | 1.14 | 0.92 |

Various exemplary embodiments are described in reference to specific illustrative examples. The illustrative examples are selected to assist a person of ordinary skill in the art to form a clear understanding of, and to practice the various embodiments. However, the scope of systems, structures and devices that may be constructed to have one or more of the embodiments, and the scope of methods that may be implemented according to one or more of the embodiments, are in no way confined to the specific illustrative examples that have been presented. On the contrary, as will be readily recognized by persons of ordinary skill in the relevant arts based on this description, many other configurations, arrangements, and methods according to the various embodiments may be implemented.

To the extent positional designations such as top, bottom, upper, lower have been used in describing this disclosure, it will be appreciated that those designations are given with reference to the corresponding drawings, and that if the orientation of the device changes during manufacturing or operation, other positional relationships may apply instead. As described above, those positional relationships are described for clarity, not limitation.

The present disclosure has been described with respect to particular embodiments and with reference to certain drawings, but the invention is not limited thereto, but rather, is set forth only by the claims. The drawings described are only schematic and are non-limiting. In the drawings, for illustrative purposes, the size of various elements may be exaggerated and not drawn to a particular scale. It is intended that this disclosure en-compasses inconsequential variations in the relevant tolerances and properties of components and modes of operation thereof. Imperfect practice of the invention is intended to be covered.

Where the term "comprising" is used in the present description and claims, it does not exclude other elements or

The invention claimed is:

1. A method for preparing integrated circuit (IC) device die from a wafer substrate having a front-side with active devices, the active devices having boundaries defined by saw lanes, and a back-side, the method comprising:
    mounting the front-side of the wafer onto protective foil;
    applying a laser to saw lane areas on the back-side of the wafer, at first focus depth to define a modification zone, wherein the modification zone is a layer with a changed crystalline structure that is between crystalline layers of the wafer, and is defined at a depth below a surface of the wafer and within active device boundaries;
    stretching the protective foil to separate IC device die from one another and expose active device side-walls; and
    dry-etching the active device side-walls including removing the changed crystalline structure at the depth below the surface and between the crystalline layers in cut areas of the wafer, so that the modification zone is substantially removed.

2. The method as recited in claim 1 further comprising, pre-grinding the wafer substrate on the back-side prior to mounting the front-side surface of the wafer onto protective foil.

3. The method as recited in claim 2, where in the modification zone is defined with infra-red imaging through the back-side of the wafer substrate, the modification zone within boundaries defined by the saw lane areas.

4. The method as recited in claim 1, wherein the dry-etching uses an etchant selected from one of the following: $SF_6$, $XeF_2$, $BrF_3$, $ClF_3$, and $F_2$.

5. The method as recited in claim 4, wherein the dry-etching includes,
    placing the stretched and separated IC device die into an etching chamber; and etching the separated IC device die with XeF$_2$ at a flow rate in a range of about 5 sccm to about 50 sccm, at a base pressure of about 21 mTorr, and cycle time is in a range of about 25 seconds to about 900 seconds.

6. The method as recited in claim 5, wherein the cycle time is in a range of about 12 seconds to about 180 seconds.

7. The method as recited in claim 1, wherein in the modification zone is etched to about a depth of about 0.1 μm to about 1μm below the surface.

8. The method as recited in claim 6, wherein in the modification zone is etched to about a depth of about 0.1 μm to about 1μm below the surface.

9. A method for preparing a laser cut device die with reduced side-wall stress, from a wafer substrate, the method comprising:
  using a laser to cut the wafer substrate along saw lanes, the saw lanes defining device boundaries, so as to yield individual device die; and
  formed by the step of using the laser, using a dry etch to remove an area of laser-induced stress to the side-walls of the individual device die,
  wherein the area of the laser-induced stress is a modification zone including a layer with a changed crystalline structure that is between mono-crystalline layers of the wafer and that is at a depth below a surface of the wafer substrate, and
  wherein etching the side-walls includes removing the changed crystalline structure at the depth below the surface and between the mono-crystalline layers in cut areas of the wafer.

10. The method as recited in claim 9, wherein the area of laser-induced stress are poly-silicon modification zones formed by the laser, and said depth is about 0.1 μm to about 1 μm below the surface.

11. The method as recited in claim 1, wherein applying the laser includes introducing poly-crystalline silicon in cut areas of the wafer that form the modification zone, wherein the modification zone is between mono-crystalline layers of the wafer, and wherein dry-etching the active device side-walls includes removing the poly-crystalline silicon at the depth below the surface and within the active device boundaries and between the mono-crystalline layers in the cut areas of the wafer.

12. The method of claim 1, wherein dry-etching the active device side-walls includes removing poly-crystalline silicon in the modification zone, wherein the modification zone is sandwiched between layers of mono-crystalline silicon, such that the poly-crystalline silicon is substantially removed from the depth below the surface of the wafer and within the active device boundaries.

13. The method of claim 1, wherein dry-etching the active device side-walls includes removing poly-crystalline silicon in the cut areas of the wafer, wherein in response to the dry-etching, the cut areas include mono-crystalline silicon with minimal poly-crystalline silicon.

14. The method of claim 9, further including introducing the modification zones during the laser process by changing a crystalline structure of a cut area of the wafer substrate from mono-crystalline silicon to poly-crystalline silicon, wherein using an etch to remove laser-induced stress to the side-walls includes removing portions of the poly-crystalline silicon in the cut area of the wafer substrate.

15. The method of claim 14, wherein a topology of the side-walls are not changed by the etching.

16. The method of claim 9, further including determining an amount of etching based on a shift of distribution of fracture strength values.

17. The method of claim 1, wherein applying the laser to the saw lane areas on the back-side of the wafer, at first focus depth, includes apply the laser to a depth of 15 μm.

18. The method of claim 1, wherein applying the laser to the saw lane areas on the back-side of the wafer includes defining the modification zone at a depth of 50 μm.

19. The method of claim 1, wherein a topology of the side-walls are not changed by the dry-etching.

* * * * *